(12) United States Patent
Fischer et al.

(10) Patent No.: US 7,045,855 B2
(45) Date of Patent: May 16, 2006

(54) SEMICONDUCTOR DEVICE AND CORRESPONDING FABRICATION METHOD

(75) Inventors: Björn Fischer, Müchen (DE); Matthias Goldbach, Dresden (DE); Stefan Jakschik, Dresden (DE); Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/777,207

(22) Filed: Feb. 13, 2004

(65) Prior Publication Data

US 2004/0229424 A1    Nov. 18, 2004

(30) Foreign Application Priority Data

Feb. 14, 2003   (DE) ................ 103 06 315

(51) Int. Cl.
*H01L 29/792*    (2006.01)
(52) U.S. Cl. ...................... 257/324; 257/411
(58) Field of Classification Search ............ 257/324, 257/325, 410, 411, 664, 758
See application file for complete search history.

(56) References Cited

U.S. PATENT DOCUMENTS

| 4,200,474 A | * | 4/1980 | Morris ............... 438/762 |
| 5,238,857 A | * | 8/1993 | Sato et al. .......... 438/151 |
| 6,511,876 B1 | | 1/2003 | Buchanan et al. |
| 2004/0051134 A1 | * | 3/2004 | Jang et al. ........... 257/316 |

* cited by examiner

*Primary Examiner*—Phuc T. Dang
(74) *Attorney, Agent, or Firm*—Morrison & Foerster LLP

(57) ABSTRACT

A semiconductor device having a gate structure, the gate structure having a first gate dielectric made of a first material having a first thickness and a first dielectric constant, which is situated directly above the channel region, and an overlying second gate dielectric made of a second material having a second thickness and a second dielectric constant, which is significantly greater than the first dielectric constant; and the first thickness of the first gate dielectric and the second thickness of the second gate dielectric being chosen such that the corresponding thickness of a gate structure with the first gate dielectric, to obtain the same threshold voltage, is at least of the same magnitude as a thickness equal to the sum of the first thickness and the second thickness. The invention also relates to a corresponding fabrication method.

8 Claims, 10 Drawing Sheets

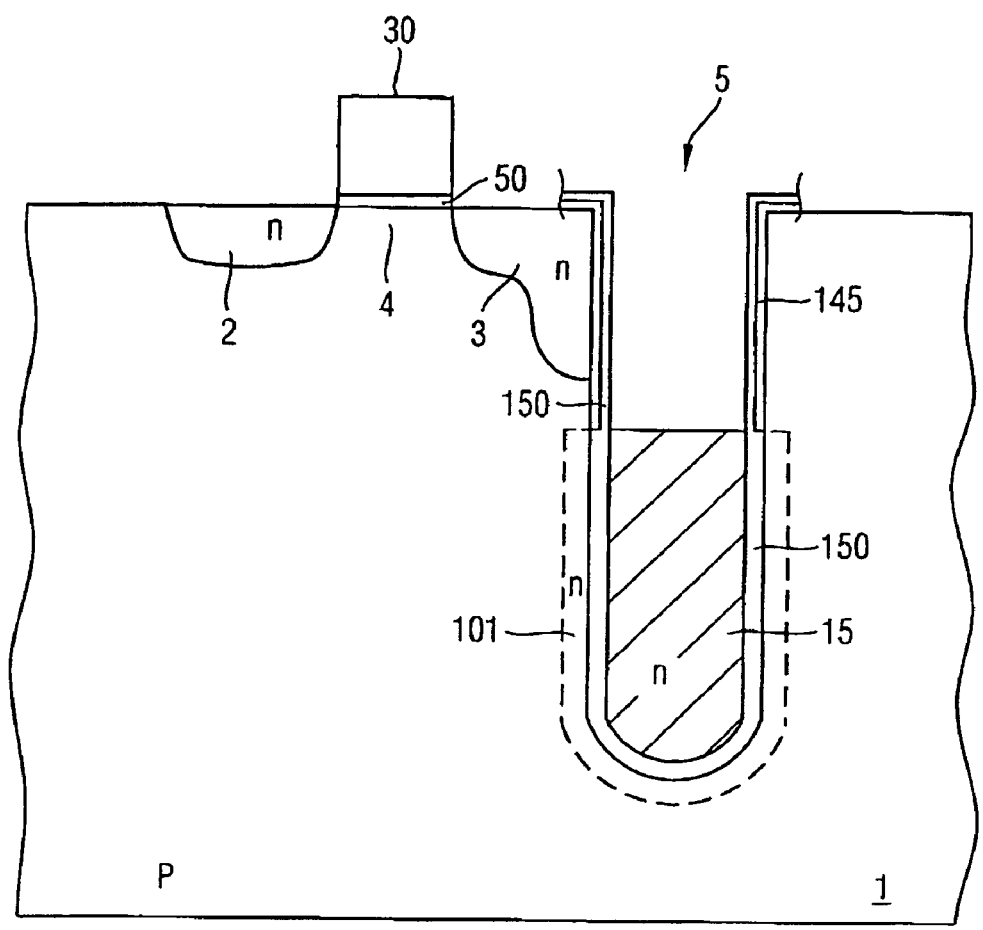

SEMICONDUCTOR DEVICE AND CORRESPONDING FABRICATION METHOD

CLAIM FOR PRIORITY

This application claims the benefit of priority to German Application No. 103 06 315.3, filed in the German language on Feb. 14, 2003, the contents of which are hereby incorporated by reference.

TECHNICAL FIELD OF THE INVENTION

The present invention relates to a semiconductor device and fabrication method.

BACKGROUND OF THE INVENTION

Although applicable in principle to any desired combination of dielectrics, the present invention and the problem area on which it is based are discussed with regard to silicon dioxide as the first dielectric and a transition metal oxide having a high k value (k=relative permittivity or dielectric constant) as the second dielectric.

So-called dielectrics having a high k value (also referred to as high-k materials) have been used for some time as capacitor dielectrics in semiconductor memory devices. These high-k materials are likewise used in MOSFETS as an alternative gate dielectric, to be precise in particular in 70 nm technology, since there direct tunneling and a pin-hole density no longer enable the use of silicon dioxide as the gate dielectric.

An overview of the current status of high-k materials is given by G. D. Wilk, R. M. Wallace, J. M. Anthony, "High-k gate electrics: Current status and materials properties considerations" in JOURNAL OF APPLIED PHYSICS, Vol. 89, No. 10, pages 5243–5275.

In particular, this article discloses using a first dielectric made of silicon dioxide with a silicon substrate and a second dielectric having a high k value made of a transition metal oxide above said first dielectric.

However, a disadvantage mentioned is that the minimum achievable equivalent thickness of such a two-layer dielectric will always be larger than the corresponding thickness of a single-layered dielectric made of silicon dioxide.

SUMMARY OF THE INVENTION

The present invention relates to a semiconductor device having a first doping region, which has a first conduction type; a second doping region, which has the first conduction type and is spaced apart from the first doping region; a channel region, which lies between the first and second doping regions and has a second conduction type; and a gate structure provided above the channel region; the gate structure having a first gate dielectric made of a first material having a first thickness and a first dielectric constant, which is situated directly above the channel region, and an overlying second gate dielectric made of a second material having a second thickness and a second dielectric constant, which is significantly greater than the first dielectric constant. The invention also relates to a corresponding fabrication method.

The present invention specifies a semiconductor device and also a corresponding fabrication method in which a threshold voltage can be set not only by means of the channel doping, and the thickness of the gate structure is reduced.

In one embodiment of the present invention, the first thickness of the first gate dielectric and the second thickness of the second gate dielectric are chosen such that the corresponding thickness of a gate structure with the first gate dielectric, in order to obtain the same threshold voltage, is at least of the same magnitude as a thickness equal to the sum of the first thickness and the second thickness.

In other words, the thicknesses of the dielectrics are dimensioned such that surface effects predominate over capacitance effects, for which reason the sum of the thicknesses of the two dielectrics may be less than an equivalent thickness in order to achieve the same capacitance density of the first dielectric.

The invention have an advantage over the known solution approaches in that the threshold voltage can additionally be controlled in another way and by means of the channel doping and, moreover, the total height of the gate structure is reduced owing to the predominance of the surface effects.

In one embodiment of the present invention, the flat-band voltage is varied with the aid of two or more dielectric materials. The procedure can be used particularly well in the case of components which do not permit a variation of the substrate doping (fully depleted FIN-FET). Through a suitable variation of a gate stack with dielectric materials of two different types of surface charges, the flat-band voltage can be shifted linearly, the equivalent thickness of the first dielectric, e.g. silicon dioxide, at least being maintained. A further advantage in this case is that the drain current, the transconductance and the switching behavior change only slightly.

However, it is also possible, equally, given a constant threshold voltage, to drive larger drain currents to have a higher transconductance and to improve the switching behavior if a comparison is drawn with single-layer gate oxides. These effects are achieved through the possibility of producing the same threshold voltage with a higher gate oxide capacitance. Suchlike can otherwise be achieved only by varying the substrate doping.

Thus, on the one hand, there is an additional degree of freedom in the component design and, on the other hand, there is the possibility of setting the threshold voltage of fully depleted field-effect transistors.

In accordance with one preferred embodiment, the first material is silicon dioxide and the second material is a transition metal oxide.

In accordance with a further preferred embodiment, the second material is a binary metal oxide selected from the following group: $Al_2O_3$, $Y_2O_3$, $La_2O_3$, $TiO_2$, $ZrO_2$, $HfO_2$.

In accordance with a further preferred embodiment, the gate structure has a third gate dielectric made of silicon dioxide, which is provided above the second gate dielectric.

In accordance with a further preferred embodiment, the semiconductor device is a field-effect transistor, in particular a FIN-FET.

In accordance with a further preferred embodiment, the semiconductor device is a parasitic field-effect transistor.

In accordance with a further preferred embodiment, the first doping region is a filling electrode of a trench capacitor of a memory cell, the second doping region is a semiconductor substrate and the channel region is a connection region of an associated selection transistor to a buried connection of the filling electrode, the gate structure comprising an insulation collar of the trench capacitor.

In accordance with a further preferred embodiment, a trench capacitor dielectric made of the second gate dielectric is provided below the insulation collar.

In accordance with a further preferred embodiment, the first doping region and the second doping region are provided at the surface of a semiconductor substrate and are isolated by an isolation trench filled with an insulator material, the gate structure being provided at least on the trench bottom.

In accordance with a further preferred embodiment, the gate structure is provided on the trench bottom and the trench walls.

In accordance with a further preferred embodiment, the isolation trench has a greater depth extent in the semiconductor substrate than the first doping region and the second doping region.

BRIEF DESCRIPTION OF THE DRAWINGS

Exemplary embodiments of the invention are illustrated in the drawings and are explained in more detail in the description below.

In the figures:

FIGS. 6a, 6b show fabrication steps of a semiconductor device in accordance with a fourth embodiment of the present invention.

In the figures, identical reference symbols designate identical or functionally identical constituent parts.

DETAILED DESCRIPTION OF THE INVENTION

Figure 1A:
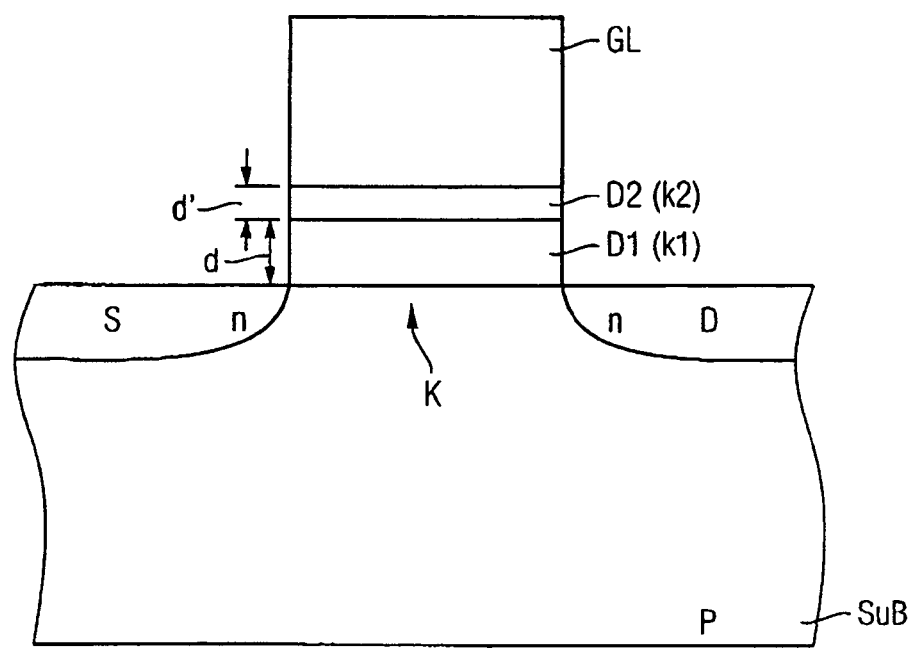
FIGS. 1a, 1b show a semiconductor device in accordance with a first embodiment of the present invention.
Figure 1B:
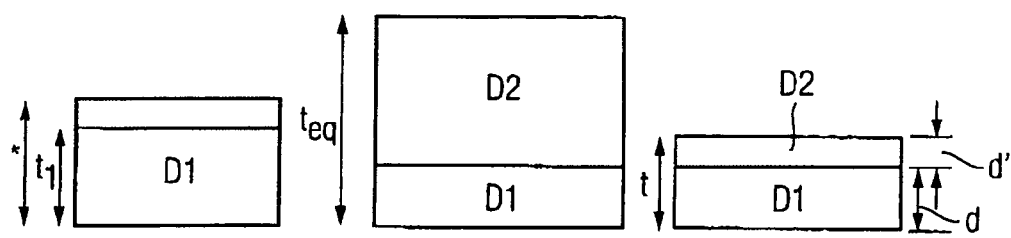

FIGS. 1a, 1b are a diagrammatic illustration of a semiconductor device in accordance with a first embodiment of the present invention.

Accurately setting the threshold voltage of field-effect transistors is a necessity for a whole host of circuit concepts. In this case, varying the gate capacitance, altering the substrate doping or else influencing the flat-band voltage have been employed as hardware possibilities. In this case, the ratio of the root of the substrate doping to the gate capacitance always shifts the threshold voltage proceeding from the flat-band voltage.

In FIG. 1a, reference symbol SUB designates a p-type semiconductor substrate, into which a source region S and a drain region D each of the n-type are introduced. A channel region K is situated in the substrate between the source and drain regions S–D. A gate structure comprising a first dielectric D1 having a first dielectric constant K1 and a thickness d and also a second dielectric D2 having a second dielectric constant k2, which is greater than the first dielectric constant k1, having a thickness d' is situated above the first dielectric D1. A gate conductor GL made of polysilicon, for example, is provided at the top side of the gate structure.

In the case of this example, the first dielectric is silicon dioxide and the second dielectric is $Al_2O_3$. The thicknesses of the first dielectric D1 and of the second dielectric D2 are chosen in such a way that the corresponding thickness of a gate structure with the first dielectric D1—that is to say single-layer silicon dioxide—in order to achieve the same threshold voltage, is at least of the same magnitude as a thickness equal to the sum of the first thickness d and the second thickness d'.

In other words, it is possible in the case of the first embodiment according to the invention, given at most the same height of the dielectric, to obtain a higher threshold voltage of the field-effect transistor since the surface charges induced by the as $Al_2O_3$ induces surface charges at the interface between silicon substrate SUB and first dielectric D1 are negative, that is to say reduce or even overcompensate for the positive surface charges in the silicon dioxide.

With reference to FIG. 1b, an explanation is given of how the thickness of the gate structure is designed proceeding from a first dielectric D1 made of silicon dioxide having a thickness t1. In accordance with the formula $$t_{eq} = t_1 + \left(\frac{k_1}{k_2}\right)t_2$$

it is possible to calculate the equivalent thickness $t_{eq}$ of a two-layer gate stack comprising the first dielectric D1 having thickness $t_1$ and the second dielectric D2 having thickness $t_2$, which supplies an identical capacitance to the first single-layer gate stack made of silicon dioxide having the thickness $t_1$. On account of this relationship, it is expected that, on the basis of capacitance considerations alone, the thickness $t_{eq}$ will always be greater than the thickness $t_1$.

With regard to the threshold voltage of such a MOSFET, however, consideration should be given to positive charges situated in the oxide in the vicinity of the silicon substrate/silicon dioxide interface, which charges shift the threshold voltage toward smaller values. These positive charges have a typical surface density of $10^{10}$ to $10^{11}$ cm$^{-2}$, depending on the crystal orientation.

It has been found that, with the aid of specific high-k materials, the surface charge can be varied and even shifted toward negative values. By way of example, if a layer stack of silicon dioxide and $Al_2O_3$ is produced, negative charges of the order of magnitude of $10^{12}$ cm$^{-2}$ to $10^{13}$ cm$^{-2}$ arise, which may shift the threshold voltage by about 300 mV to 800 mV. Depending on the thermostability it is possible to use different materials in order to produce the negative charges at the surface with respect to the silicon substrate. Further examples are $Y_2O_3$, $La_2O_3$ (300 to 1400 mV) shift of the threshold voltage. However, $TiO_2$ and $ZrO_2$ and $HfO_2$ also exhibit negative charge at the surface, so that the threshold voltage or flat-band voltage may be shifted toward higher values, typically up to 800 mV in the case of these materials.

It has furthermore been found that in the case of specific materials such as e.g. $Al_2O_3$ as second dielectric, a surface effect predominates in the case of small thicknesses, so that it is possible to reduce the thickness of the two-layered gate stack to a thickness t which is at most equal in magnitude to the first thickness $t_1$, a higher threshold voltage still being obtained after the reduction.

In the present case, the thickness t is less than the thickness $t_1$, so that the thickness t' of an equivalent signal-layer dielectric D1 even increases.

Consequently, the two-layered gate dielectric structure according to the present invention exhibits the amazing effect that layer thickness reduction unexpectedly enables a threshold voltage increase. Analogous presentations can likewise be made for negative shifts in the threshold voltage.

Figure 2:
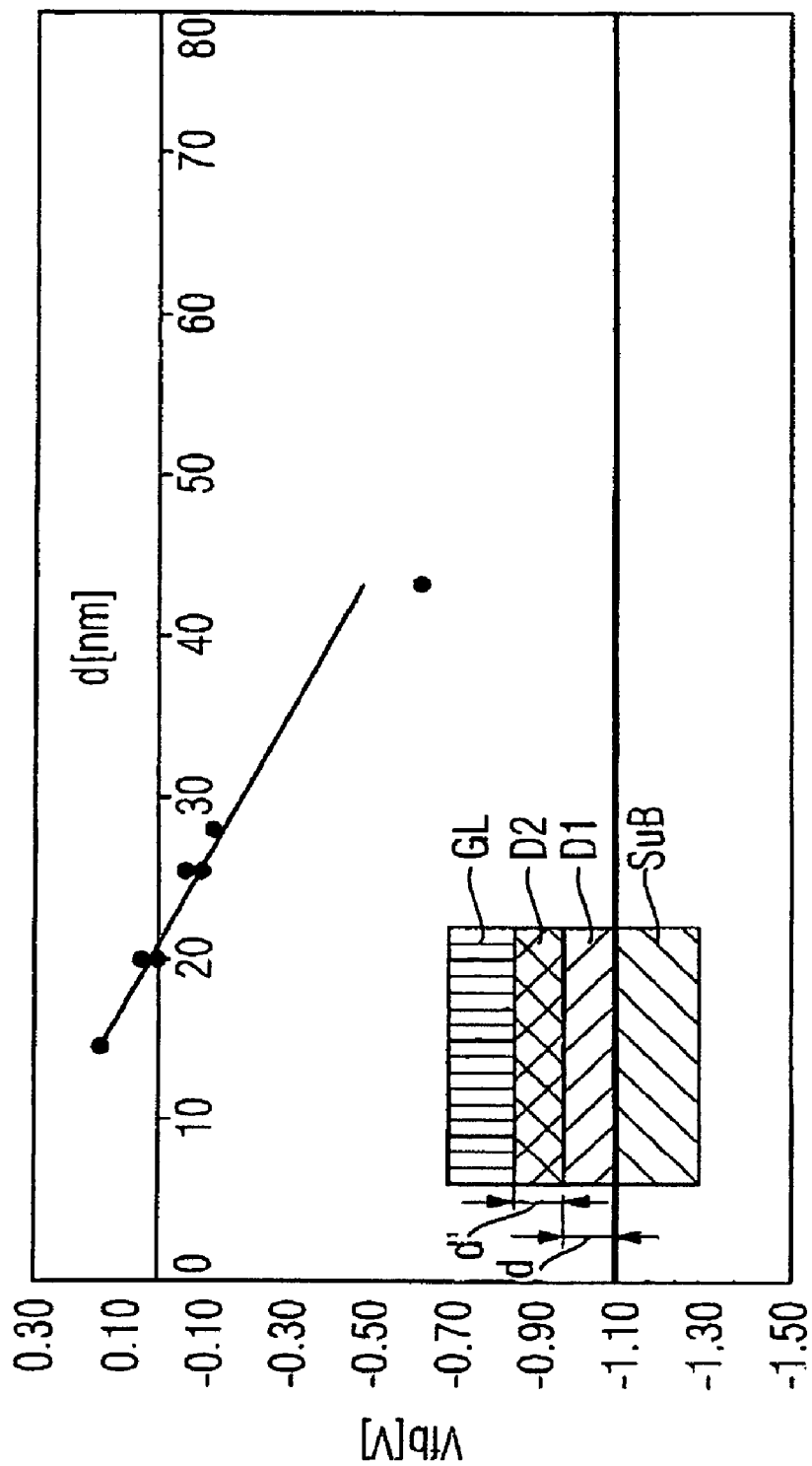
FIG. 2 shows a flat-band voltage on the thickness of the first gate insulation layer in the first embodiment of the present invention.

FIG. 2 is an illustration of the dependence of the flat-band voltage on the thickness of the first gate insulation layer in the case of the first embodiment of the present invention.

In the case of the example shown in FIG. 2, the flat-band voltage is plotted against the thickness of the first dielectric D1 for the gate stack of FIG. 1a. For this example, the silicon dioxide film for the first dielectric D1 was constructed by means of a thermal oxidation. This mode of construction minimizes the defect concentration in the interface plane. Building on this, an $Al_2O_3$ film was deposited as the second dielectric D2 by means of the ALD method (ALD=atomic layer deposition). The layer thicknesses of both layers were controllable within narrow limits. It was thus possible to vary the flat-band voltage in a range of about 0.7 V, i.e. from 0.1 V to −0.6 V. Typical layer thicknesses for equivalent oxide thickness of about 5 nm are between 1 nm silicon dioxide to 4 nm silicon dioxide and 1 nm $Al_2O_3$ to 10 nm $Al_2O_3$.

Figure 3:
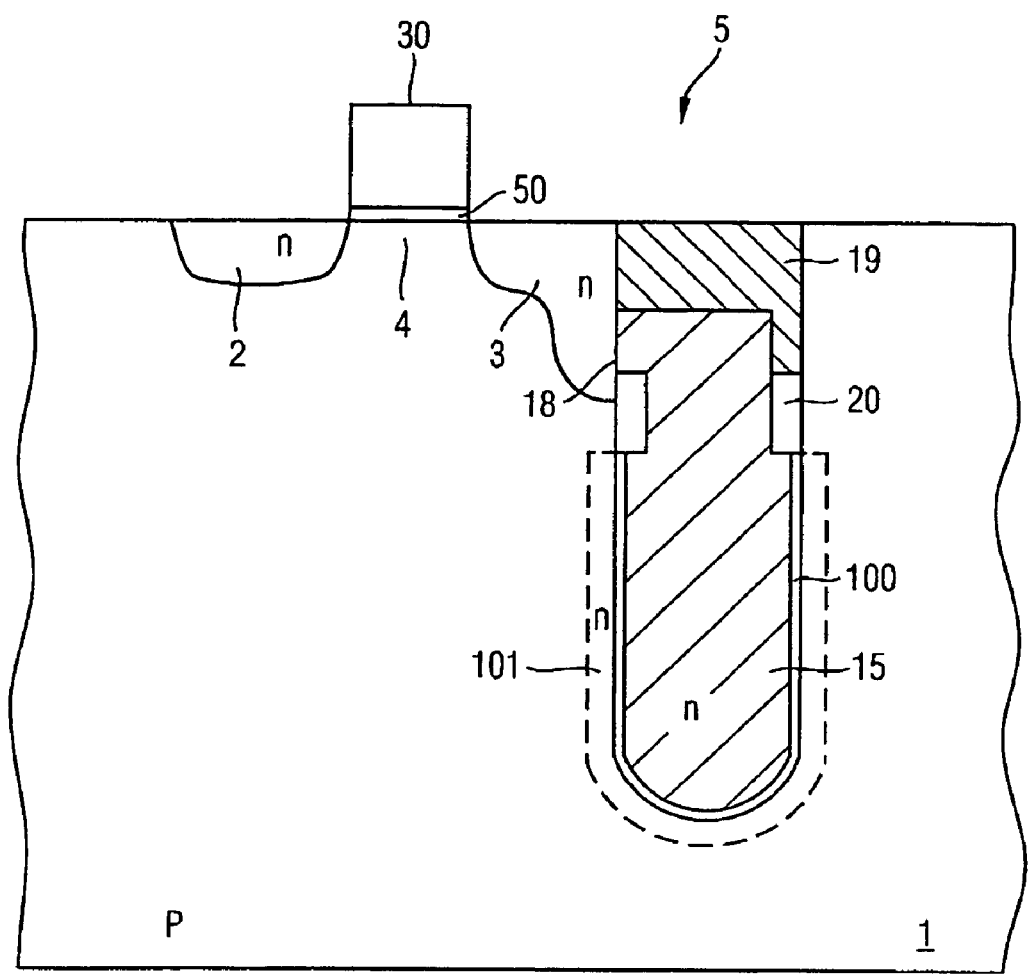
FIG. 3 shows a known semiconductor device in the form of a memory cell with a selection transistor and a trench capacitor with an insulation collar.

FIG. 3 is a diagrammatic illustration of a known semiconductor device in the form of a memory cell with a selection transistor and a trench capacitor with an insulation collar.

In FIG. 3, reference symbol 1 denotes a p-type silicon semiconductor substrate, into which a typical DRAM memory cell having a trench capacitor and a selection transistor is introduced. The selection transistor comprises the n-type regions 2, 3, the channel region 4, the gate dielectric 50 and the gate conductor 30. The trench capacitor is formed in a trench 5, at the lower region of which a capacitor dielectric 100 is deposited at the walls. A capacitor plate is an n-type buried plate 101 in the substrate 1. In the upper region, the trench capacitor has an insulation collar 20 made of densified silicon dioxide. An n-type filling electrode 15 is provided in the capacitor, which electrode ends with a buried connection 18 at a top side, an insulation cover 19 made of silicon dioxide being applied above said buried connection.

For ever shrinking DRAM structures, it is necessary to further reduce the thickness of the insulation collar. This can be achieved by means of an increased implantation into the p-type well 3 or other simple doping possibilities in the region of the insulation collar 20. However, the implantation involves the problem that the doping is not permitted to become so high directly at the buried connection 18, in order that the leakage current from the buried connection 18 into the p-type well 3 does not become too high. At the present time, use is made of oxide which has deposited and densified. The threshold voltage of the parasitic field-effect transistor comprising the buried connection 18, the n-type well 3, the substrate 1 and the buried plate 101 is set by means of a sufficient thickness in connection with a corresponding doping.

Thus, the problem of performing a fine setting of the threshold voltages of parasitic field-effect transistors arises in the fabrication of such microelectronic circuits.

Figure 4A:
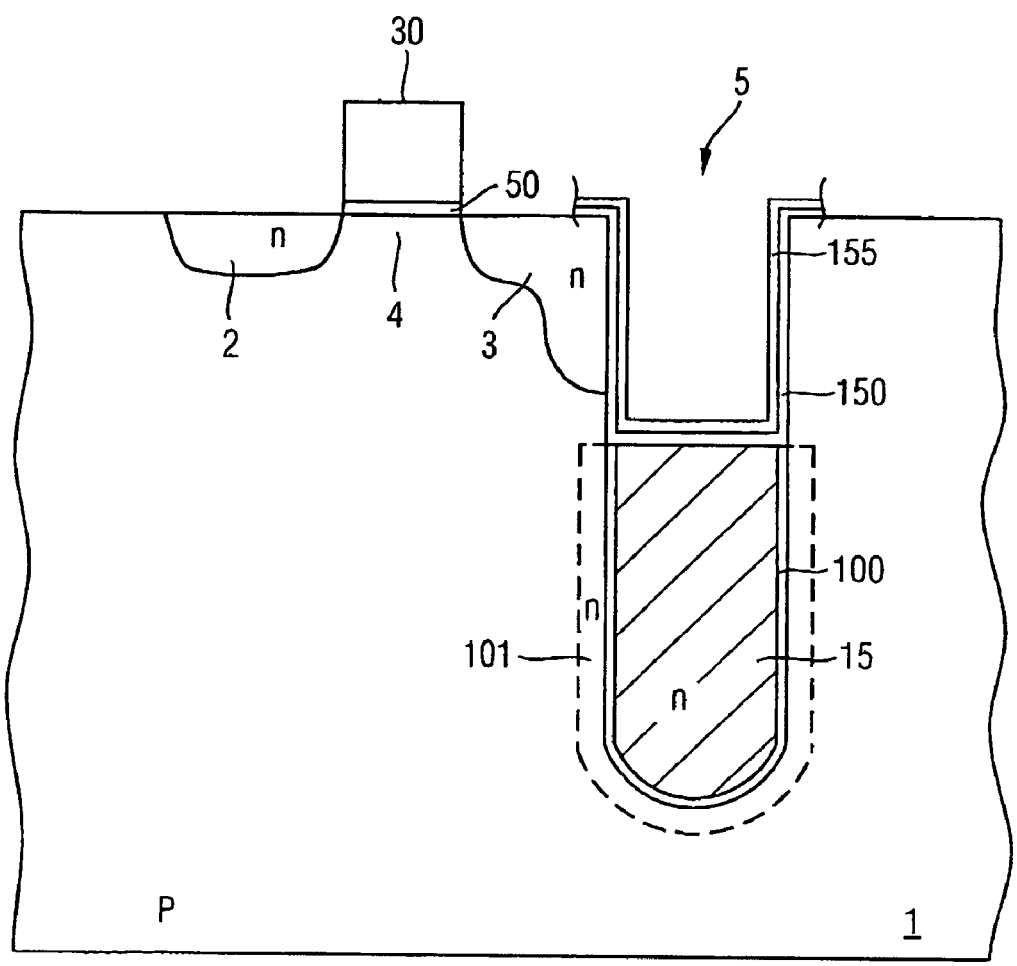
FIGS. 4a–4c show fabrication steps of a semiconductor device in accordance with a second embodiment of the present invention.
Figure 4B:
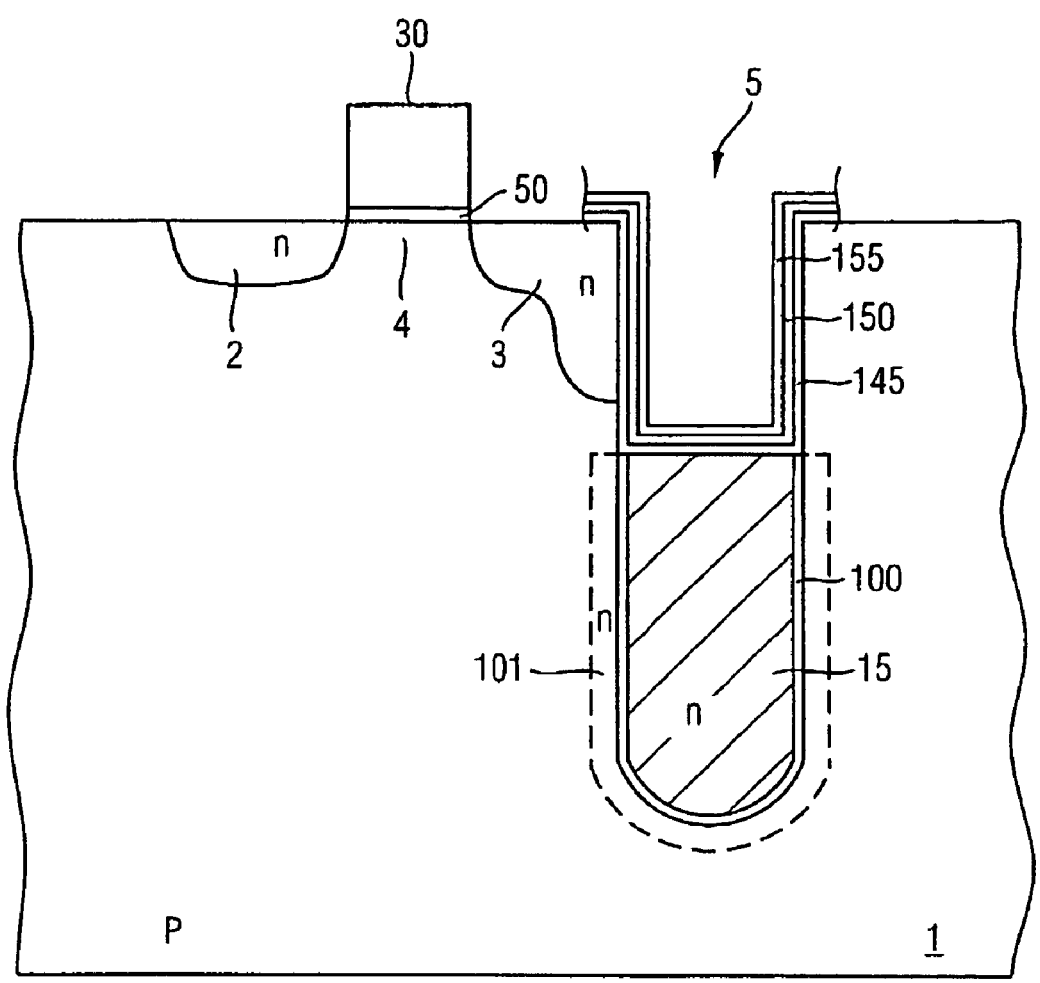
Figure 4C:
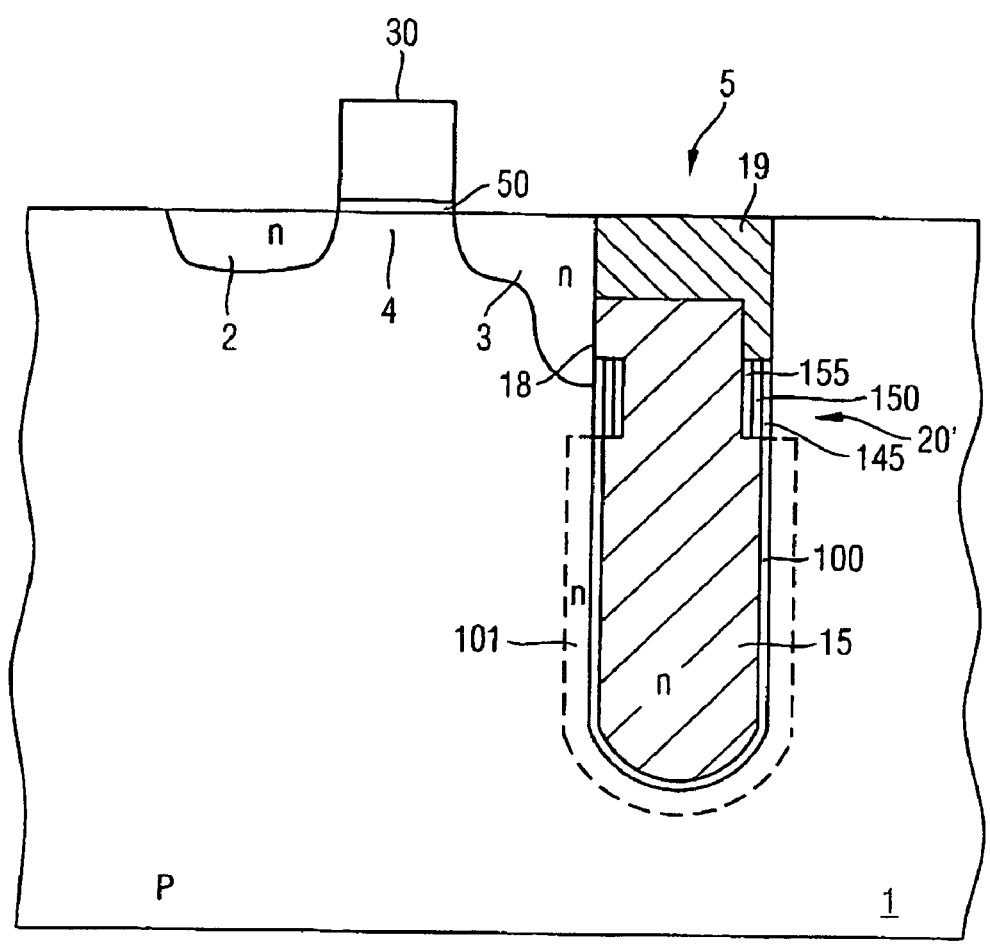

FIG. 4a–c are diagrammatic illustrations of fabrication steps of a semiconductor device in accordance with a second embodiment of the present invention.

In the embodiment in accordance with FIG. 4a, firstly an $Al_2O_3$ layer 150 is deposited as second dielectric D2 in the upper trench region. FIG. 4a and corresponding figures for further embodiments show the deposition only partially and diagrammatically, since it is normally effective before the completion of the gate structure 50, 30 of the selection transistor.

A thin silicon dioxide layer 155 is then deposited as an overlying layer in the upper region of the trench capacitor, said silicon dioxide layer later serving as third dielectric. Afterward, a thermal annealing process is carried out in an $O_2$ atmosphere, which has the effect that a further silicon dioxide layer 145 forms as first dielectric at the interface between the second dielectric 150 made of $Al_2O_3$ and the silicon substrate 1.

In this connection, it should be mentioned that the third dielectric layer 155 may also be omitted, to be precise for a required threshold voltage of the parasitic n-FET.

With reference to FIG. 4c, the dielectric stack constructed in this way, comprising the layers 145, 150, 155, is then patterned to form the modified insulation collar 20', which is not only thinner than the known insulation collar 20, but likewise has a higher threshold voltage for the parasitic field-effect transistor. The further filling of the trench and the formation of the trench connection 18 above the insulation collar and also the provision of the insulation cover 19 are effected by standard method steps.

Figure 5:
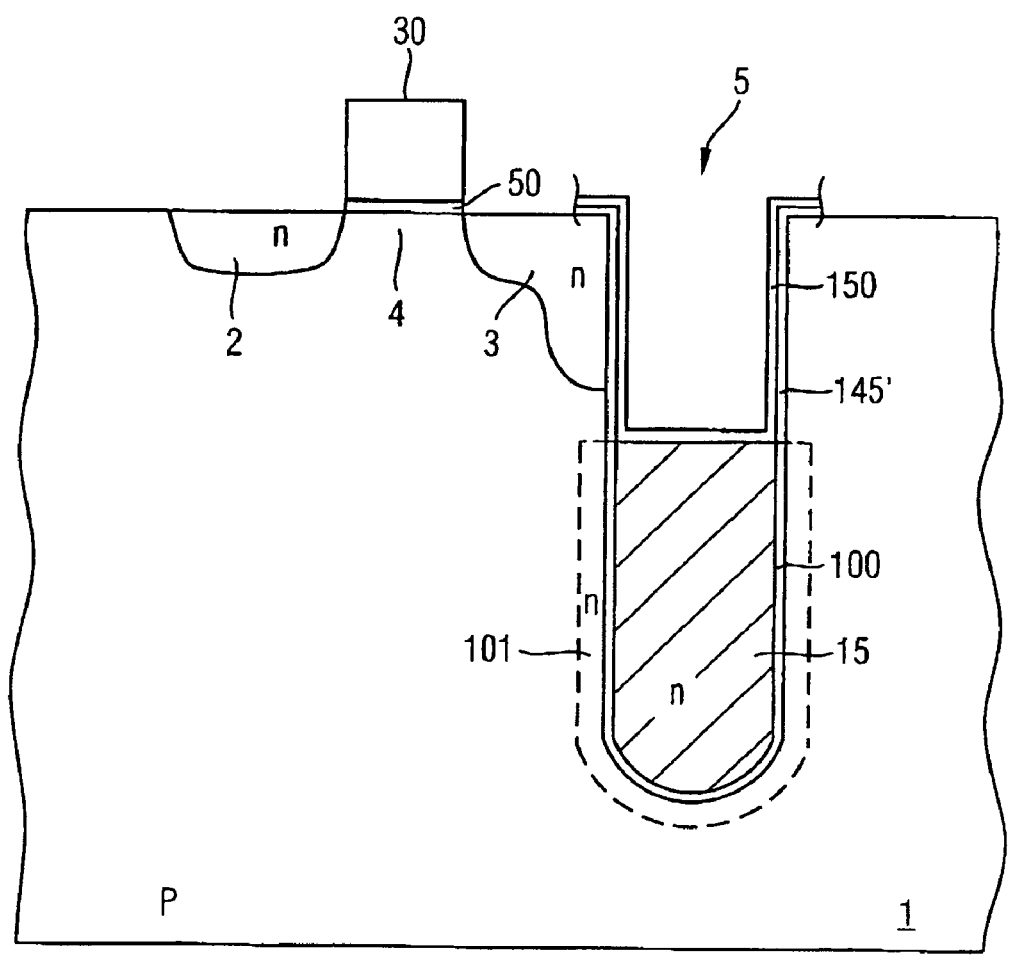
FIG. 5 shows a semiconductor device in accordance with a third embodiment of the present invention.

FIG. 5 is a diagrammatic illustration of a semiconductor device in accordance with a third embodiment of the present invention.

In the embodiment shown in FIG. 5, firstly a thermal oxidation for forming the first dielectric made of silicon dioxide 145' is carried out on the trench walls in the upper trench region. This is followed by a deposition of the layer made of $Al_2O_3$ 153 as second dielectric. The gate dielectric stack thus comprises two layers in this embodiment. The further method steps are analogous to FIGS. 4b and c.

Figure 6A:
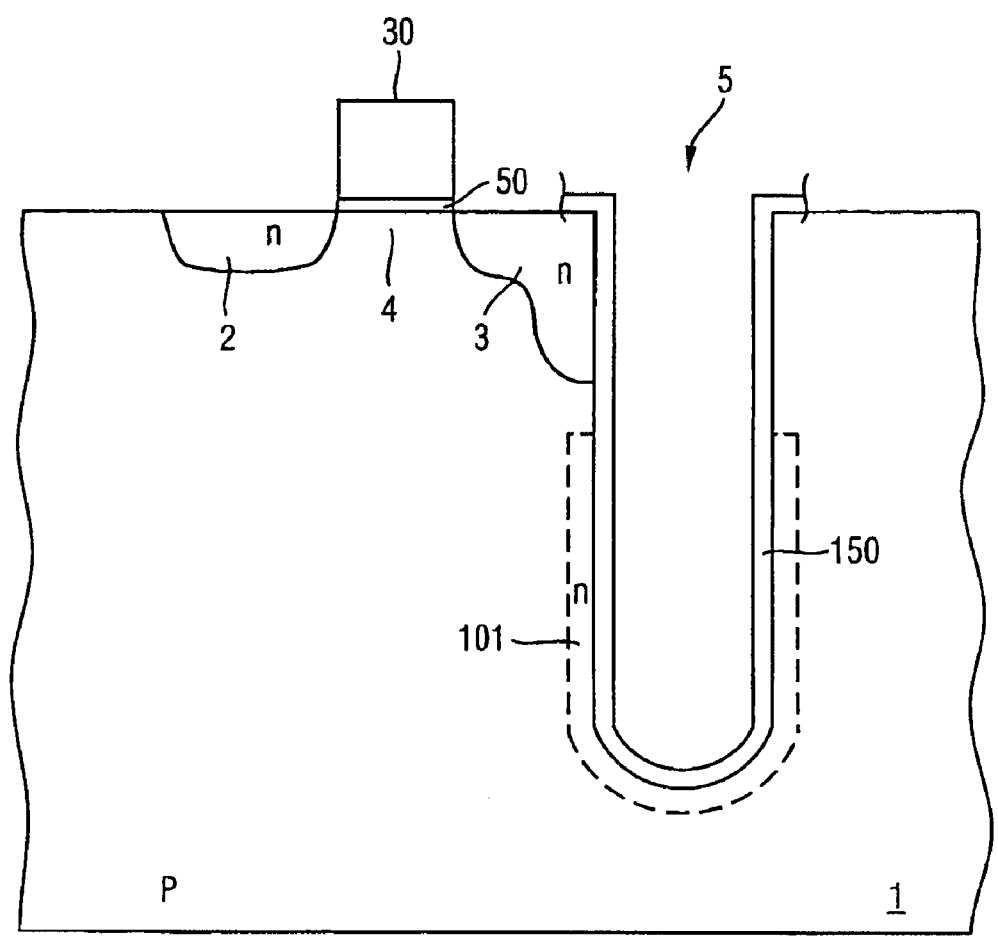

FIGS. 6a, b are diagrammatic illustrations of fabrication steps of a semiconductor device in accordance with a fourth embodiment of the present invention.

In the embodiment in accordance with FIG. 6, the trench capacitor dielectric is a layer 150 made of $Al_2O_3$, which will later form the second, upper dielectric in the two-layered insulation collar. FIG. 6a shows the method step of depositing this dielectric in the trench 5.

With reference to FIG. 6b, the n-type filling electrode 15 is then provided in the lower trench region by means of known deposition and etching-back techniques. As can be seen in the upper region of the trench in FIG. 6b, an annealing step is then carried out in the presence of oxygen, during which the oxygen diffuses through the $Al_2O_3$ layer 150 toward the interface of the silicon substrate 1, where it forms a silicon dioxide layer 145 as first dielectric. In this case, too, the further method steps are analogous to FIGS. 4b, c.

In the following two exemplary embodiments, the invention is applied to STI structures (STI=Shallow Trench Isolation).

Figure 7:
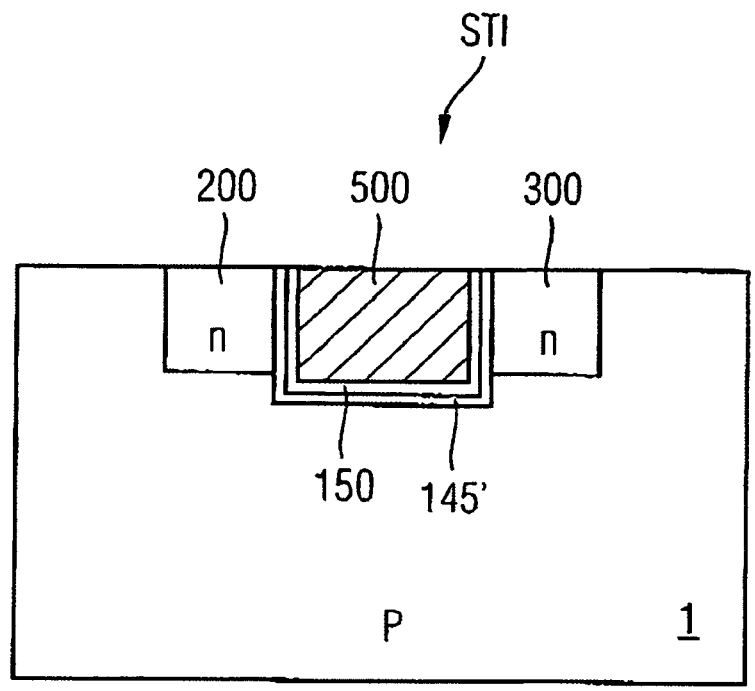
FIG. 7 shows a semiconductor device in accordance with a fifth embodiment of the present invention.

FIG. 7 is a diagrammatic illustration of a semiconductor device in accordance with a fifth embodiment of the present invention.

In the embodiment in accordance with FIG. 7, an isolation trench STI is provided in a p-type semiconductor substrate 1 between two n-type wells, 200, 300. The trench walls and the trench bottom are lined with the double-layered gate dielectric stack according to the invention, comprising a first gate dielectric 145' made of silicon dioxide and an overlying second gate dielectric 150 made of $Al_2O_3$.

In this application example, at the present time the filling oxide 500 for the isolation trenches is deposited and densified. In addition, attempts are being made to reduce the interface states by means of suitable oxidation.

The gate structure fabricated according to the invention makes it possible to reduce the sub-STI leakage currents through the negative charges situated permanently at the interface.

Figure 8:
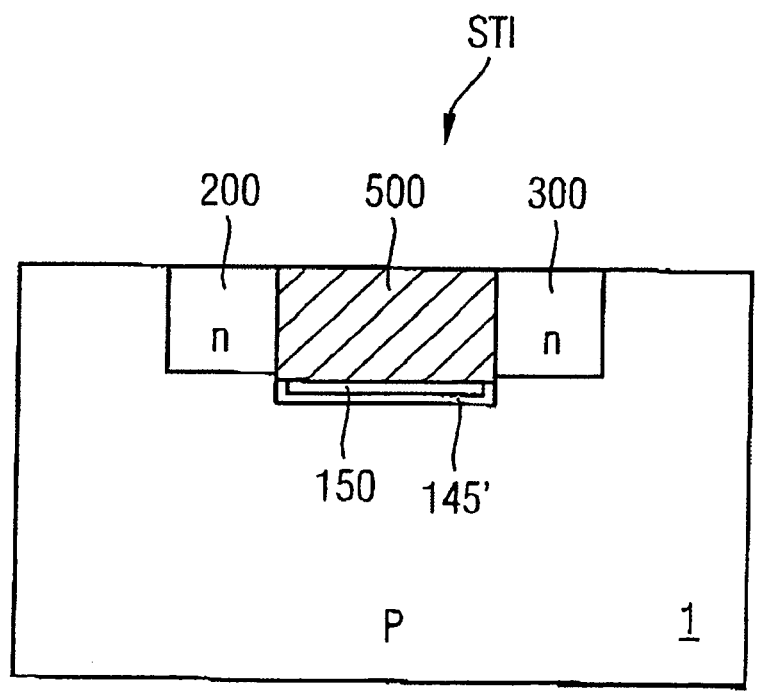
FIG. 8 shows a semiconductor device in accordance with a sixth embodiment of the present invention.

FIG. 8 is a diagrammatic illustration of a semiconductor device in accordance with a sixth embodiment of the present invention.

In the embodiment in accordance with FIG. 8, therefore, the two-layered gate dielectric structure is removed at the trench walls and provided at the trench bottom, so that this gate dielectric structure cannot influence the n-type regions 200, 300.

Although the present invention has been described above on the basis of preferred exemplary embodiments, it is not restricted thereto, but rather can be modified in diverse ways.

Moreover, the particular configuration of the semiconductor device is not restricted to the MOSFETs shown, but can also be applied to arbitrary gate-controlled semiconductor components.

What is claimed is:

1. A semiconductor device, comprising:
   a first doping region, which has a first conduction type;
   a second doping region, which has the first conduction type and is spaced apart from the first doping region;
   a channel region, which lies between the first and second doping regions and has a second conduction type; and
   a gate structure provided above the channel region, wherein
   the gate structure having a first gate dielectric made of a first material with a first thickness and a first dielectric constant, which is situated directly above the channel region, and an overlying second gate dielectric made of a second material with a second thickness and a second dielectric constant, which is significantly greater than the first dielectric constant,
   the first thickness of the first gate dielectric and the second thickness of the second gate dielectric configured such that the corresponding thickness of a gate structure with the first gate dielectric, to obtain a same threshold voltage, is at least of a same magnitude as a thickness equal to a sum of the first thickness and the second thickness,
   the gate structure has a third gate dielectric made of silicon dioxide, which is provided above the second gate dielectric,
   a parasitic field-effect transistor is involved, and
   the first doping region is a filling electrode of a trench capacitor of a memory cell, the second doping region is a semiconductor substrate and the channel region is a connection region of an associated selection transistor to a gate connection of the filling electrode and the gate structure comprises an insulation collar of the trench capacitor.

2. The semiconductor device according to claim 1, wherein the first material is silicon dioxide and the second material is a transition metal oxide.

3. The semiconductor device according to claim 2, wherein the second material is a binary metal oxide selected from the group of: $Al_2O_3$, $Y_2O_3$, $La_2O_3$, $TiO_2$, $ZrO_2$, $HfO_2$.

4. The semiconductor device according to claim 1, wherein a field-effect transistor is involved.

5. The semiconductor device according to claim 1, wherein a trench capacitor-dielectric made of the second gate dielectric is provided below the insulation collar.

6. The semiconductor device according to claim 1, wherein the first doping region and the second doping region are provided at a surface of a semiconductor substrate and are isolated by an isolation trench filled with an insulator material, and the gate structure is provided at least on the trench bottom.

7. The semiconductor device according to claim 6, wherein the gate structure is provided on the trench bottom and the trench walls.

8. The semiconductor device according to claim 6, wherein the isolation trench has a greater depth extent in the semiconductor substrate than the first doping region and the second doping region.

* * * * *